United States Patent [19]

Malinowski et al.

[11] Patent Number: 4,859,969

[45] Date of Patent: Aug. 22, 1989

[54] SINGLE TRANSISTOR DUAL MODE CRYSTAL OSCILLATOR(U)

[75] Inventors: Gregory J. Malinowski, Oakhurst; Stanley S. Schodowski, Wayside, both of N.J.

[73] Assignee: The United States of America as represented by the Secretary of the Army, Washington, D.C.

[21] Appl. No.: 509,269

[22] Filed: Jun. 13, 1983

[51] Int. Cl.$^4$ .................. H03B 21/00; H03B 5/36
[52] U.S. Cl. ......................... 331/43; 331/76; 331/46 R
[58] Field of Search ............ 331/42, 43, 60, 66, 331/761, 116 R, 176

[56] References Cited

U.S. PATENT DOCUMENTS

| | | | |
|---|---|---|---|
| 4,088,968 | 5/1978 | Pradal et al. | 331/116 R |
| 4,139,842 | 2/1979 | Fujida et al. | 331/116 R |
| 4,199,734 | 4/1980 | Dresser | 331/116 R |
| 4,302,731 | 11/1981 | Aslida | 331/116 R |
| 4,359,697 | 11/1982 | Takahashi | 331/116 R |
| 4,360,808 | 11/1982 | Smith et al. | 318/518 |
| 4,510,464 | 4/1985 | Takahashi | 331/116 R |

OTHER PUBLICATIONS

"A High Quality UHF Source... Applications", 10/81, pp. 906–910, Radio Commun., vol. 57, #10, Abst.
Malinowski et al, "Implementation . . . Quartz Crystals", 5/81, pp. 286–290, Proc. 35, FC Symp. Abst.
Miguel, "Temperature Compensates . . . Oscillator", 6/4/82, pp. 576–588, Proc. Symp. FC36, Abst.
Rosati et al., "State of the Art . . . and Future", 11/85, pp. 386–390, IEEE, vol. 2, Abst.

Primary Examiner—Nelson Moskowitz
Attorney, Agent, or Firm—Michael J. Zelenka; Robert A. Maikis

[57] ABSTRACT

A single transistor dual mode crystal oscillator circuit is described which may excite more than one C-mode frquency in a crystal simultaneously such as the fundamental, used as a clock driver frequency, and a beat frequency between the third harmonic and the third overtone frequency, simultaneously. Each signal is thereafter passed through a separate amplifier means to further enhance those outputs for use.

8 Claims, 4 Drawing Sheets

SINGLE TRANSISTOR DUAL MODE CRYSTAL OSCILLATOR(U)

The invention described herein may be manufactured, used, and licensed by or for the Government for Governmental purposes without the payment to me of any royalties thereon.

BACKGROUND AND FIELD OF THE INVENTION

Dual mode crystal oscillators used for clock driving circuits, e.g., generally require several gain elements such as transistors, as well as several multiplier and mixer circuits to generate the frequency signals desired. In one suggested system, the oscillator requires at least two transistors, one for oscillating at fundamental, another for oscillating at third harmonic, in addition to mixers and multipliers. This of course, makes large the number of parts needed, increases the cost, power consumption, complexity and adjustment of such circuit to produce the desired output frequencies. Clearly, the possibility of accomplishing the same dual frequency generation, yet while requiring only one transistor and eliminating mixer, multiplier, and post-amplification type circuit elements, would be most useful.

BRIEF DESCRIPTION OF THE INVENTION

The outputs of a crystal oscillator are amplified in a single-stage transistor amplifier circuit. By providing a dual L-C network in the emitter to ground path, it is possible to generate select frequency signals at the collector and also at the emitter of this select biased transistor in addition to the usual fundamental frequency. The described oscillator circuit combination is suitable, for instance, for simultaneously exciting two C-mode frequency signal in certain crystal resonators, while yet using only a single transistor amplifier element. For example, the operator may wish to generate a fundamental and third overtone frequencies, or combination thereof, using the circuitry described here. To further utilize the desired outputs from the collector and emitter of the transistor, a band pass and a low pass filter are alternately provided, each followed by an operational amplifier circuit. For further background information, reference is made to a prior invention of S. Schodowski entitled "Dual Harmonic Mode Quartz Thermometric Sensing Device", for which a patent application, Ser. No. 487,560 has been filed on Apr. 20, 1983.

OBJECTS OF THE INVENTION

An object of the invention is to provide a dual mode crystal oscillator circuit which may utilize only a single gain element.

Another object is to devise a dual mode crystal oscillator circuit eliminating separate multiplier and mixer circuits, yet still provide both a clock driver frequency and a combination beat frequency output signal.

LIST OF FIGURES

Other objects and advantages will be readily apparent to those skilled in the art in connection with the attached description of the invention in which.

DETAILED DESCRIPTION OF THE INVENTION

Figure 1:
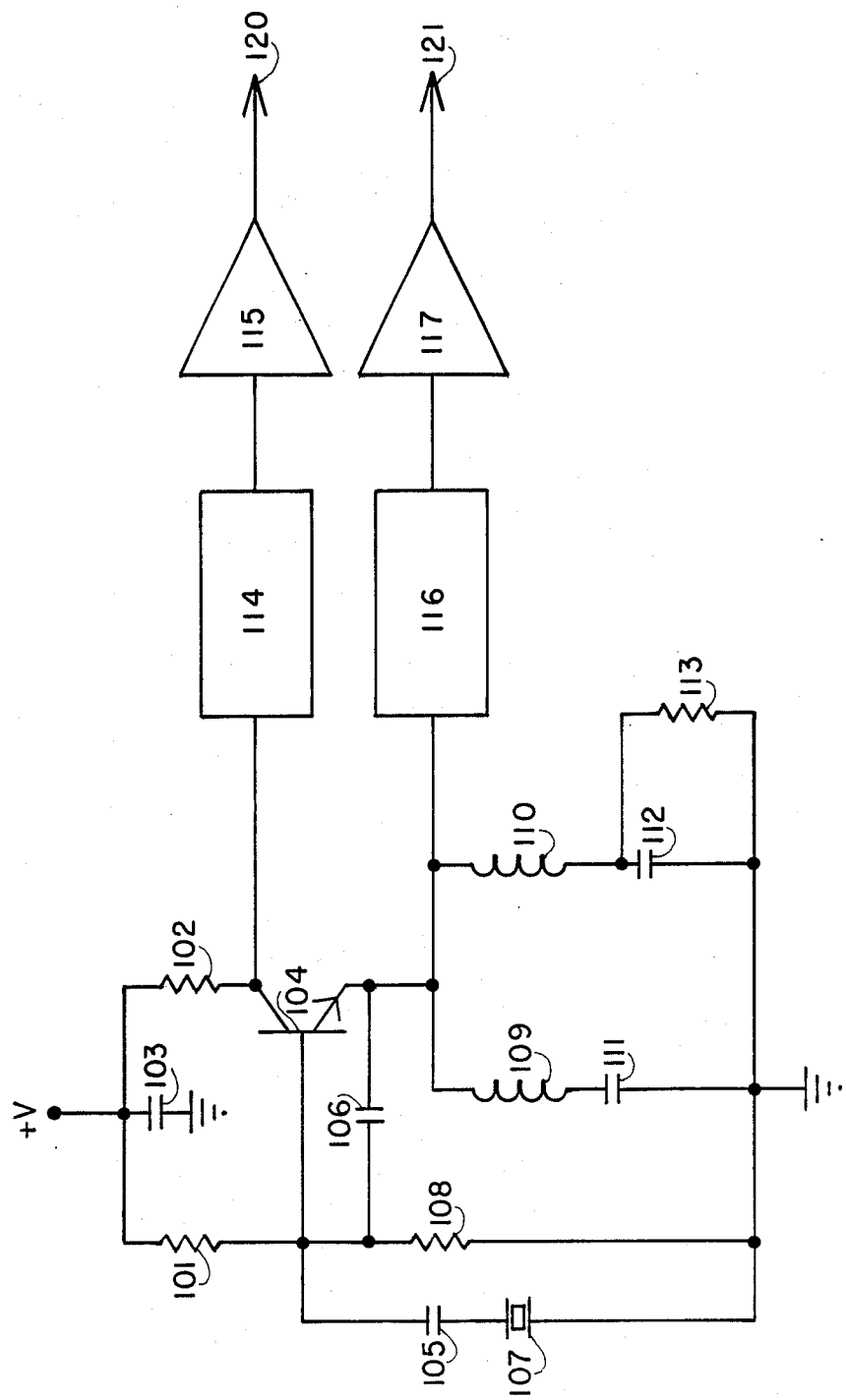
FIG. 1 is a schematic diagram of the dual mode crystal oscillator system according to the invention.

FIG. 1 shows a schematic of a dual mode circuit in accordance with the invention. A transistor 104 is chosen that has adequate gain at the third overtone frequency of the quartz crystal to permit the circuit to oscillate. Resistors 101, 102, 108, 113 are chosen such that the transistor 104 is biased into the linear region of operation. Capacitor 103 is used as a power supply bypass. Its value is chosen to generally keep the RF from going back along the supply line. Capacitor 105 is a load capacitor chosen to adjust the frequency of oscillation. It is envisioned as being adjustable and in some feedback arrangement for stabilizing the crystal resonant frequency, Capacitor 106 is chosen to provide adequate feedback to sustain oscillation, chosen in manner also believed to be conventional. The L-C circuit, consisting of inductors 109, 110 and capacitors 111, and 112, is adjusted for exciting in the crystal 107, fundamental and third overtone frequencies and for not exciting undesired frequencies, e.g., the B mode of an SC-cut crystal. Also, by proper selection of components 109–112, different drive levels can be achieved for each mode oscillation.

Since the oscillator is self-limiting, the transistor is dynamically biased into its nonlinear region. This results in generation of harmonics of the crystal modes and further provides mixing of the various modes and harmonics. Signal outputs appear at both the collector and emitter of transistor 104, as shown.

Attached to the collector is a bandpass filter, 114, which passes the fundamental frequency of the crystal, which is output at 120 after passing through amplifier 115, and attenuates all other signals. Attached to the emitter of the transistor is a low pass filter, 116, which passes 121, the beat frequency between the third overtone and third harmonic of crystal 107; it should be noted that the third overtone frequency is different from the third harmonic. The filters 114 and 116 are followed by amplifiers 115 and 117 to raise the signal level and to provide isolation from outside influences. Amplifier 115 is an r.f. type while amplifier 117 is a low frequency type amplifier. To be noted is that 121, the output of amplifier 117, is the combination fundamental and third overtone frequency of interest which was mentioned earlier.

Shown therefore is the use of a single transistor in providing dual mode oscillation and generation of harmonics and mixing products. The need for only a single transistor of course simplifies the dual mode approach; it reduces the parts count, the power consumption, and maintains the proper amplitude relationship between the mixer inputs, among other substantial benefits.

Figure 2:
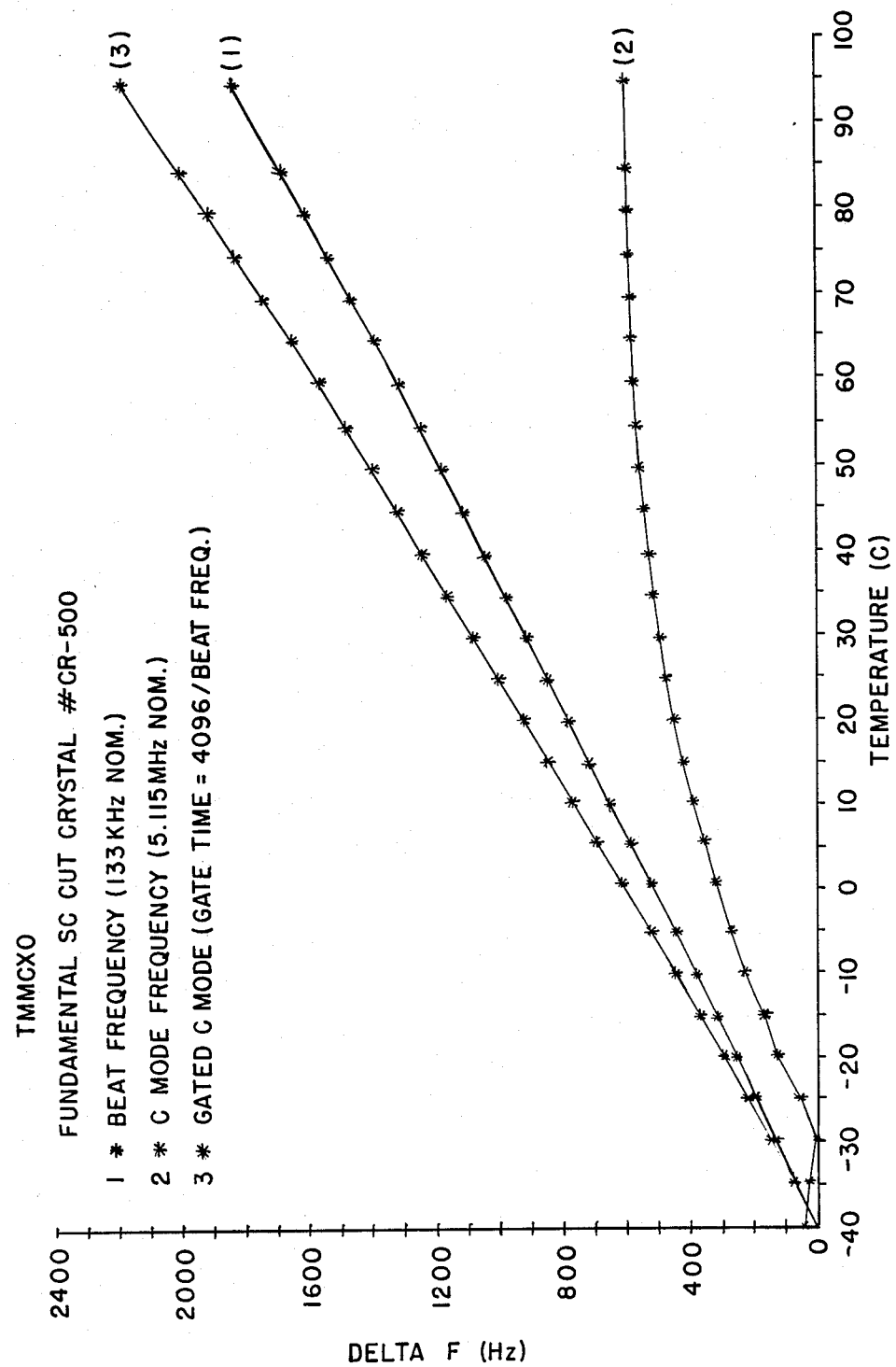
FIG. 2 shows the change in the beat and certain C-mode frequencies of the crystal circuit, in relationship to temperature change.

In FIG. 2, charts are shown of variations with temperature of the beat frequency and certain C-mode frequencies, for an SC-cut crystal (number CR-500). Nominal value of beat frequency is 133 KHz and noninal value of C-mode frequency is 5.115 MHZ, for the gated C-mode line marked 3, the gate time is about 4,096/beat frequency. The chart of the beat frequency marked 1, as noted earlier, seems linear with temperature. The beat frequency is one of the two main output signals designed for this dual mode crystal oscillator, the other being the usual fundamental signal.

Figure 3:
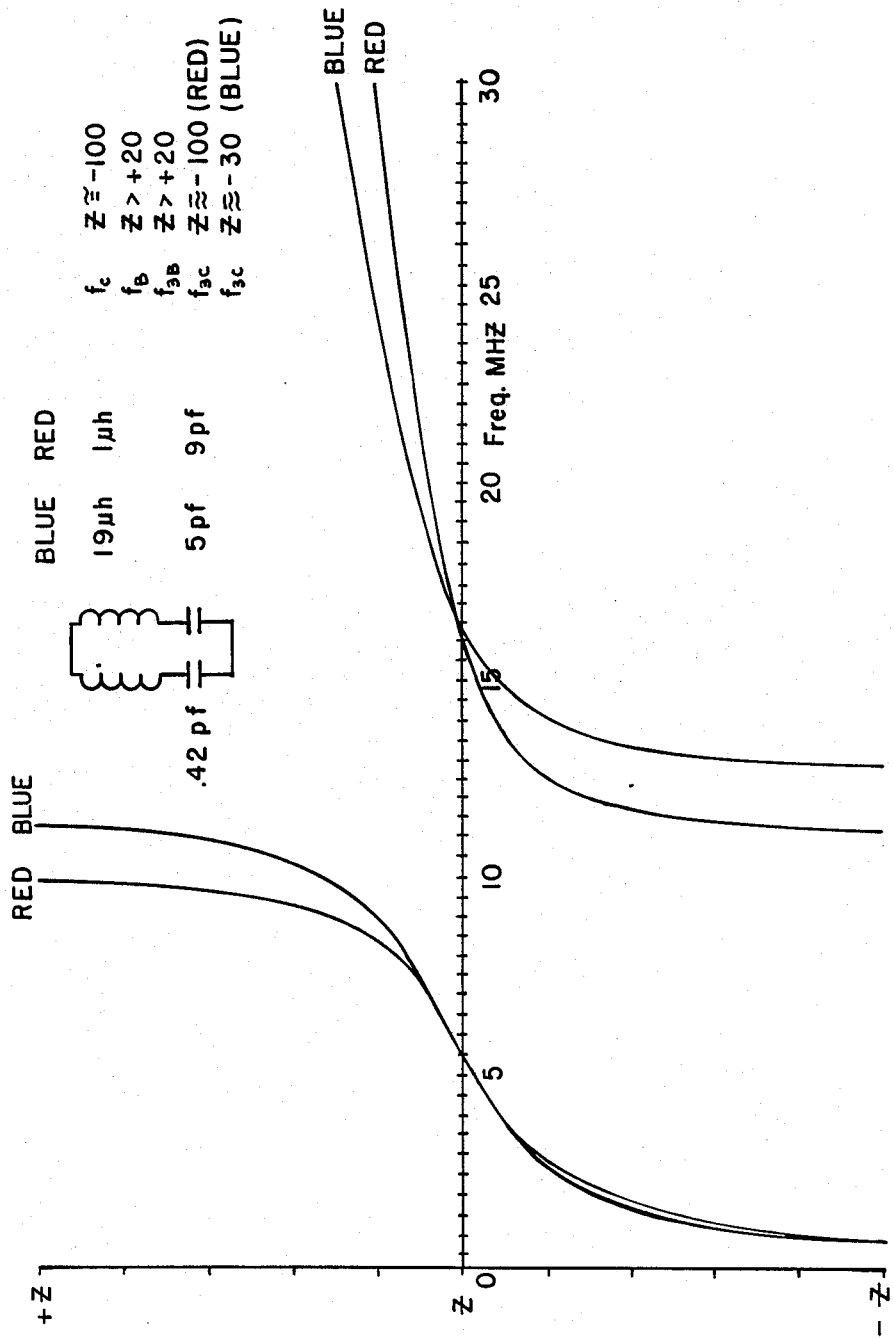
FIG. 3 shows an impedance versus frequency plot for the crystal circuit, which is useful in choosing the values of elements 109 through 112 of FIG. 1.

In FIG. 3, the impedance of the dual L-C circuit comprising elements 109-112 of FIG. 1, is plotted against frequency for two variations of element values for 109 and 111. In the plots marked "blue", inductor 109 is 19 μh. and capacitor 111 is 5 pf., whereas for the plots marked "red", 109 is 11 μh and 111 is 9 pf. This chart is useful for selecting values of 109-112 to fix the impedance levels within the circuit, as desired, for excitation of the frequencies at 120 and 121 of FIG. 1 (fundamental and beat frequencies) and to fix certain impedances within the circuit for nonexcitation of undesired frequencies such as the B-mode in this particular application. To excite a C-mode harmonic in the crystal, Z is arranged to be approximately equal to $-100$; for third harmonic C-mode, Z should be approximately $-300$ for the blue case and $-100$ for the red case. If Z is greater than 20, the undersired B-mode fundamental and third harmonics would be generated.

Figure 4:
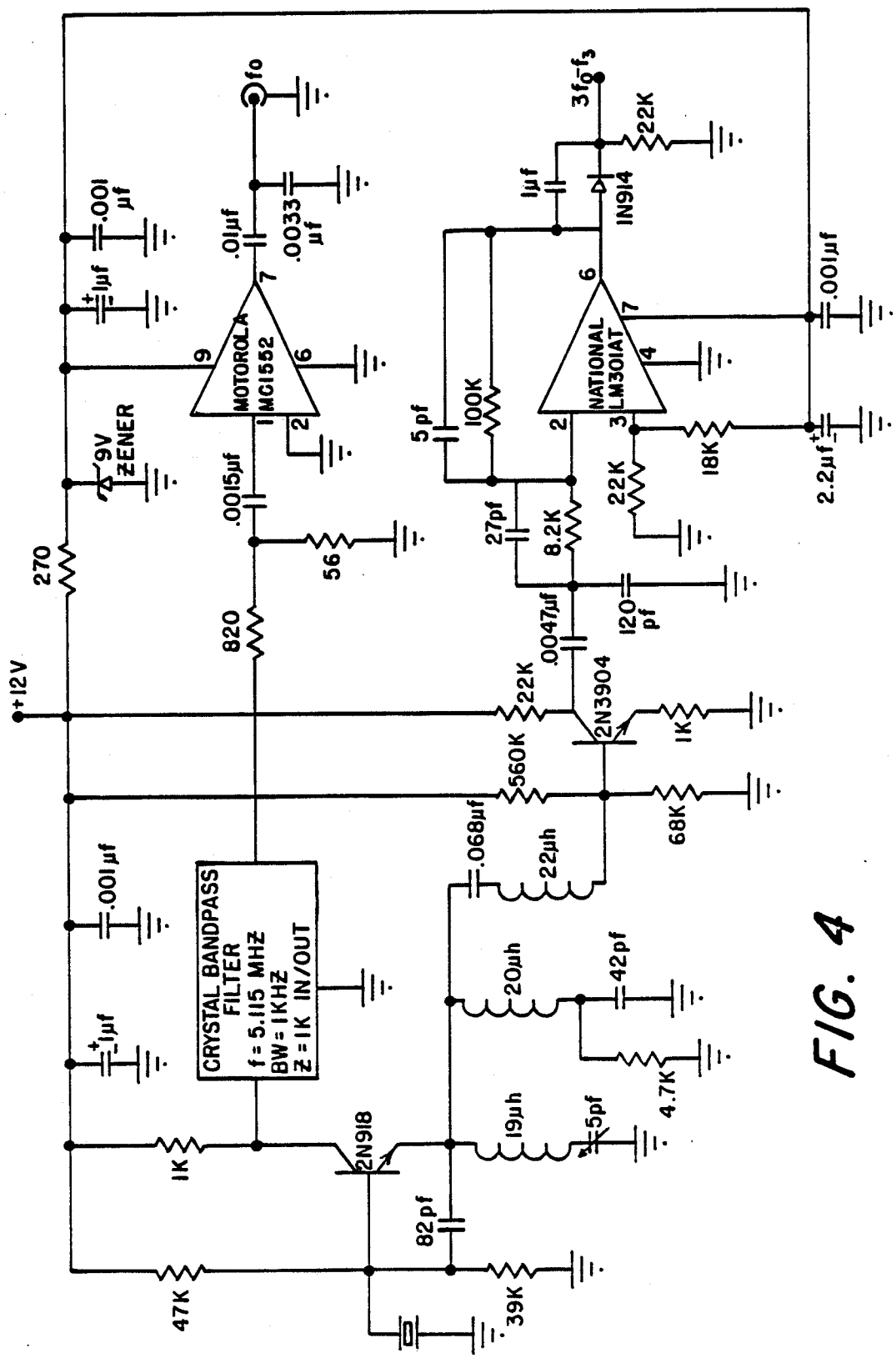
FIG. 4 shows a detailed schematic of a further refined dual mode crystal oscillator circuit according to the invention.

FIG. 4 is another embodiment dual oscillator circuit along the general lines of the circuit shown in FIG. 1, with detailed circuit values shown and certain refinements over the generalized FIG. 1 circuit. Outputs of this circuit are, of course, the beat frequency $3f_0-f_3$, and also the fundamental $f_0$, used for such applications as clock drive signal.

While the invention has been described in terms of certain particular embodiments, it should be understood that also included in the description are other modifications and substitutions which may be made within the spirit and scope of the invention as will be recognized by those skilled in the art.

What is claimed is:

1. A dual mode oscillator circuit comprising:
    a resonator device;
    a single transistor having a base, an emitter and a collector, said transistor being coupled in a base input-emitter to ground configuration;
    means for coupling said resonator device between ground and the base input of said transistor;
    means coupled to said transistor base for biasing said transistor for operation in its linear region;
    feedback means coupled between said emitter and said base; and
    circuit means in the emitter to ground path of said transistor, said circuit means comprising a parallel arrangement of at least two series L-C circuits, the L and C values of said L-C circuits being chosen so as to excite in said resonator, at least two distinct frequencies simultaneously.

2. The circuit of claim 1 wherein the frequencies excited in the said resonator are C-mode only and include a fundamental frequency, and the beat frequency between the third harmonic and third overtone frequencies.

3. The circuit of claim 2 wherein the resonator is an AT-cut crystal.

4. The circuit of claim 2 wherein the resonator is an SC-cut crystal.

5. The circuit of claim 4 wherein the said circuit has an output at said collector for the said fundamental frequency and another output at said emitter for the said beat frequency, there being a band pass filter and first amplifier means in series with said fundamental output and a low pass filter and second amplifier means in series with said beat output for enhancing the signals from said outputs.

6. A dual mode crystal oscillator circuit comprising:
    an SC-cut crystal connected in series with an adjustable load capacitor at the base input of a transistor, the transistor biased by voltage applied to resistors in the following paths, transistor base to ground, transistor base to voltage, transistor collector to voltage, transistor emitter to ground; there being in the emitter to ground path a feedback capacitor, also a circuit comprising a parallel arrangement of at least two series L-C circuits the L-C values chosen so as to excite desired fundamental and third harmonic C-mode frequencies in the crystal while not exciting certain undesired frequencies in the crystal, the said crystal excited in C-mode for dual harmonic frequencies, the capacitor in one of the L-C circuits having a biasing resistor in parallel thereto, a power supply bypass capacitor also being included from the voltage supply to ground;
    a band pass filter connected to the collector output of the transistor, which filter selectively passes only the crystal's fundamental frequency;
    an R.F. amplifier circuit following said band pass filter for providing an enhanced output signal of the fundamental frequency;
    a low pass filter connected to the emitter output of the transistor, which filter selectively passes only the beat frequency between the third harmonic and third overtone frequencies; and
    a second amplifier circuit following said low pass filter for providing a second enhanced output signal for the said beat frequency.

7. The circuit of claim 6 wherein the oscillator circuit frequencies which are undesired and hence not excited in the said circuit include the B-mode excitation frequencies.

8. The circuit of claim 7 wherein the excited C-mode frequencies are gated.

* * * * *